United States Patent
Worley et al.

(10) Patent No.: US 8,427,796 B2
(45) Date of Patent: Apr. 23, 2013

(54) HIGH VOLTAGE, HIGH FREQUENCY ESD PROTECTION CIRCUIT FOR RF ICS

(75) Inventors: Eugene R. Worley, Irvine, CA (US); ByungWook Min, San Antonio, TX (US); Der-woei Wu, Fremont, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 466 days.

(21) Appl. No.: 12/748,067

(22) Filed: Mar. 26, 2010

(65) Prior Publication Data

US 2011/0176245 A1 Jul. 21, 2011

Related U.S. Application Data

(60) Provisional application No. 61/296,212, filed on Jan. 19, 2010.

(51) Int. Cl.
*H02H 9/00* (2006.01)

(52) U.S. Cl.
USPC .............................................. 361/56; 361/111

(58) Field of Classification Search ............ 361/56, 361/91.1, 111
See application file for complete search history.

(56) References Cited

U.S. PATENT DOCUMENTS

| | | | |
|---|---|---|---|
| 5,815,360 | A | 9/1998 | Consiglio |
| 6,233,130 | B1 * | 5/2001 | Lin .............................. 361/118 |
| 6,768,616 | B2 | 7/2004 | Mergens |
| 6,858,902 | B1 | 2/2005 | Salling |
| 6,924,963 | B2 | 8/2005 | Young et al. |

(Continued)

FOREIGN PATENT DOCUMENTS

EP 1806784 A1 7/2007

OTHER PUBLICATIONS

Kwang-Hoon Oh, Charvaka Duvvury, Kaustav Banerjee, and Robert W. Dutton, "Gate Bias Induced Heating Effect and Implications for the Design of Deep Submicron ESD Protection", IEEE Transactions on Device and Materials Reliability, pp. 36-42, vol. 2, Issue 2, Jun. 2002.

(Continued)

*Primary Examiner* — Stephen W Jackson
*Assistant Examiner* — Tien Mai
(74) *Attorney, Agent, or Firm* — Ramin Mobarhan

(57) ABSTRACT

Improved ESD protection circuits for RFICs requiring both high voltage and high frequency operation is described. A cascode grounded gate snap-back NFET (GGNFET) combined with a precharge circuit and a diode network results in a positive ESD protection clamp with low capacitance and high turn-on voltage. The positive ESD protection clamp provides ESD protection to an IC during a positive voltage ESD pulse. Exemplary embodiments of a negative ESD protection clamp are disclosed where a bias circuit or a charge pump is used in place of the precharge circuit in a manner that allows the combination of the bias circuit or the charge pump together with a diode network and a cascode grounded gate snap-back NFET to provide protection against negative ESD voltage pulses. The combination of a positive and a negative ESD protection clamp provides ESD protection to an IC during either a positive or a negative voltage ESD pulse. Alternate embodiments further reduce the capacitance of the ESD protection circuit by using only a positive ESD clamp to provide ESD protection during a positive ESD pulse while protection for a negative ESD pulse is provided by a discharge path formed by a path of an RF front-end switch coupled to a negative ESD diode.

25 Claims, 15 Drawing Sheets

U.S. PATENT DOCUMENTS

| | | |
|---|---|---|
| 7,061,737 B2 * | 6/2006 | Chen ........................ 361/91.1 |
| 7,593,204 B1 | 9/2009 | Iversen |
| 7,719,806 B1 * | 5/2010 | Boyd et al. ..................... 361/56 |
| 2002/0154462 A1 | 10/2002 | Ker |
| 2002/0159208 A1 | 10/2002 | Ker et al. |
| 2004/0142527 A1 | 7/2004 | Chen |
| 2005/0122644 A1 | 6/2005 | Ma |
| 2005/0231867 A1 | 10/2005 | Morishita |
| 2006/0050452 A1 | 3/2006 | Oguzman |
| 2006/0065932 A1 * | 3/2006 | Huang et al. ................ 257/355 |
| 2006/0087788 A1 * | 4/2006 | Gibet et al. ................... 361/100 |
| 2007/0070564 A1 | 3/2007 | Ma |
| 2007/0228475 A1 | 10/2007 | Burdeaux et al. |
| 2008/0232010 A1 | 9/2008 | Wang |
| 2009/0073621 A1 | 3/2009 | Thijs |
| 2009/0180224 A1 | 7/2009 | Ker |
| 2009/0189182 A1 | 7/2009 | Hodel et al. |

OTHER PUBLICATIONS

International Search Report and Written Opinion—PCT/US2011/021752—ISA/EPO—May 24, 2011.

* cited by examiner

HIGH VOLTAGE, HIGH FREQUENCY ESD PROTECTION CIRCUIT FOR RF ICS

CLAIM OF PRIORITY UNDER 35 U.S.C. §119

The present Application for Patent claims priority to Provisional Application No. 61/296,212 entitled "Bi-directional HV ESD clamp for RF power amplifiers" filed Jan. 19, 2010, and assigned to the assignee hereof and hereby expressly incorporated by reference herein

TECHNICAL FIELD

The present disclosure relates to electronics and more particularly to the field of electrostatic discharge (ESD) protection circuitry, and more specifically, improvement of ESD protection for radio frequency integrated circuits.

BACKGROUND

Electrostatic discharge (ESD) protection is a great concern in low voltage deep-submicrometer silicon technology. The reliability of silicon integrated circuits (ICs), due to smaller feature sizes, is becoming more and more critical. With thinner gate oxide thickness, silicon circuits are more sensitive to the stress from ESD. During manufacture and assembly of ICs ESD may cause damage. Despite the mature technology of high speed switching, and high-voltage robustness for DC ESD protection, radio frequency (RF) ESD protection design in state-of-the-art silicon technologies is still a challenge—especially or high voltage applications.

More specifically, RF power amplifiers require large signal swings both above and below ground, and they need to operate at a high frequency. This becomes particularly challenging in the case where the voltage swing at a pad node of an integrated circuit, coupled to a PA, exceeds the operating limits of the available silicon process.

FIG. 1 depicts a typical schematic block diagram representing ESD protection circuit 102 of integrated circuit (IC). The representation illustratively depicts ESD protection circuit 102, coupled at one end to a protected node of IC 100 and IC pad 104, and at the other end to ground. ESD protection circuit 102 comprises an ESD protection device such as a cascode grounded gate snap-back NFET (GGNFET). ESD protection circuit 102 comprises two NFET devices, Np1 and Np2, in a cascode configuration.

Under normal operation of IC 100 ESD protection circuit 102 should be off. During a positive polarity ESD pulse, the GGNFET provides an active discharge path to shunt a current surge from IC pad 104 to ground. Furthermore, it clamps the IC pad voltage to a sufficiently low level to avoid damaging the protected circuit node of the IC.

ESD protection circuit 102 is characterized by a turn-on voltage. This is the maximum voltage the ESD protection circuit can withstand before it turns on. More specifically ESD protection circuit 102 can withstand, during normal operation, two times the maximum operating voltage of each NFET. As an example, in a typical 65 nm process long channel NFETs have a maximum operating voltage of 3.6 Volts, therefore the maximum allowable voltage swing at the IC pad is 7.2V. Integrated silicon PA output voltage swing requirements may exceed the 7.2 volts, making the ESD protection circuit shown in FIG. 1 a poor choice for PA designs requiring voltage swings above 7.2V.

Furthermore, the GGNFET requires drain ballast resistance to achieve conduction uniformity. The ballasting requirement greatly increases the parasitic load capacitance at the drain node D of the GGNFET, thus limiting the high frequency operation of the RF power amplifier. As the operating frequency increases to the gigahertz range, the parasitic capacitance acts as a low impedance path to ground and significantly degrades the performance of the RF Power Amplifier, or any other RF circuit coupled to the IC pad.

For radio frequency integrated circuits (RFICs), it is imperative to develop ESD protection circuits with low parasitic capacitance for high voltage, high frequency applications.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary"

used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The present disclosure is directed to improved ESD protection circuits for RFICs requiring both high voltage and high frequency operation.

Various embodiments of ESD protection circuits capable of providing ESD protection only during positive ESD voltage pulses, or only during negative ESD voltage pulses or during both positive and negative ESD pulses are disclosed.

Figure 1:
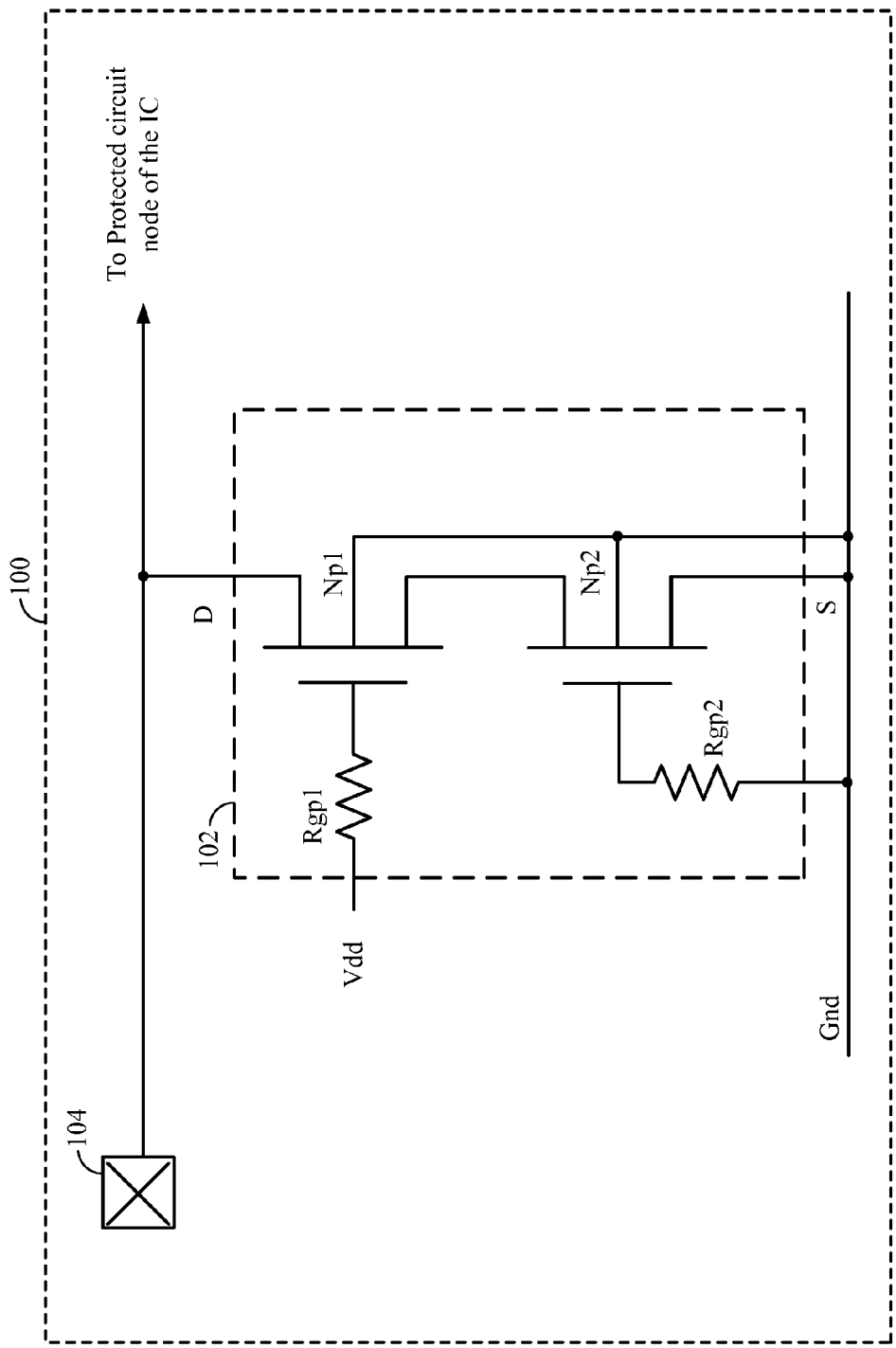
FIG. 1 depicts a typical schematic block diagram representing ESD protection circuit of an integrated circuit (IC).
Figure 2:
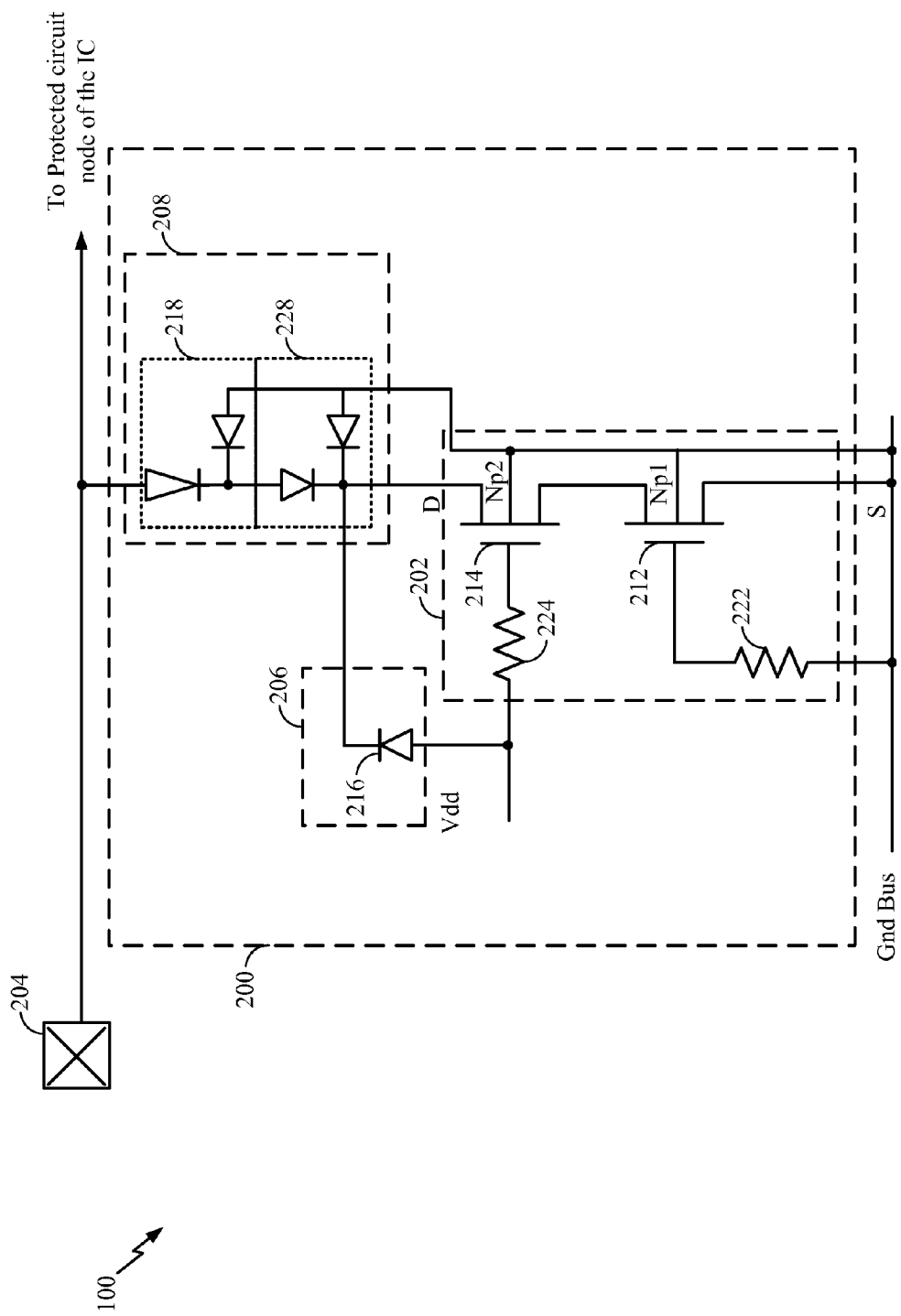
FIG. 2 shows an embodiment of an ESD protection device providing ESD protection during a positive voltage ESD pulse.

FIG. 2 shows an embodiment of an ESD protection device providing ESD protection during a positive voltage ESD pulse. As shown in FIG. 2, ESD protection device 200 comprises precharge circuit 206, diode network 208 and cascode grounded gate NFET (GGNFET) 202.

Diode network 208 comprises a plurality of diodes connected in series. For illustrative purposes only two, 218 and 228, are shown. One skilled in the art may appreciate that any number of diodes connected in series may form diode network 208. Each diode is a P+Nwell diode. There are applications where the diode network may comprise of only one P+Nwell diode.

The anode of the diode placed first in the series configuration is coupled to the IC pad, and the cathode of the diode placed last in the series configuration is coupled to the drain, node D, of cascode GGNFET 202. In the specific example shown in FIG. 2, anode of first diode 218 is coupled to IC pad 204. Cathode of first diode 218 is coupled to anode of second diode 228 and cathode of second diode 228 is coupled to the drain, node D, of cascode GGNFET 202. A first terminal of precharge circuit 206 is coupled to positive supply Vdd and a second terminal of precharge circuit 206 is coupled to cathode of second diode 228 and the drain of cascode GGNFET 202. Source, node S, of cascode GGNFET 202 is coupled to ground.

Cascode GGNFET 202 comprises of at least two NFET devices, first NFET 212 (Np1) and second NFET 214 (Np2). The gate terminal of first NFET device 212 is coupled to ground through resistor 222. The drain terminal of first NFET device 212 is coupled to the source terminal of second NFET device 214. Second NFET device 214 is cascoded to first NFET device 212. The gate of second NFET device 214 is coupled to the positive supply Vdd through resistor 224. The positive supply Vdd provides bias to cascode GGNFET device 202 by coupling to the gate of second NFET device 214 through resistor 224.

It will be apparent to those of skill in the art that a charge pump circuit, operating from a positive voltage supply, may also be used to provide bias to cascode GGNFET device 202 by coupling to the gate of second NFET device 214.

Precharge network 206 comprises diode 216. Anode of diode 216 is coupled to the positive potential Vdd. Cathode of diode 216 is coupled to the drain, node D, of cascode GGNFET 202. In an alternate embodiment, a diode connected MOSFET can be used in lieu of diode 216.

Cascode GGNFET 202 provides an active discharge path to shunt the current surge from IC pad 204 to ground during a positive voltage ESD pulse. Diode network 208 reduces the voltage across cascode GGNFET 202 to the level that the cascode GGNFET can withstand (i.e., without it breaking down, or turning on during normal operation), as the signal at IC pad 204 swings above ground. The diode network increases the turn-on voltage of ESD protection device 200 during normal operation by the sum of the junction voltage of each diode in series to the GGNFET. As a result, the allowable voltage swing at the IC pad increases. A selected number of diodes connected in series may be used to set the turn on voltage of the ESD circuit at the desired level.

The diode network also reduces the high capacitive loading presented to IC pad 204 by cascode GGNFET 202. By coupling precharge circuit 206 to diode network 208 the capacitive load to IC pad 204 is reduced to that of diode network 208.

Precharge circuit 206 establishes a DC voltage level at the drain of cascode GGNFET 202. The DC voltage level equals to the voltage at the positive supply Vdd minus the junction voltage of diode 216. Establishing a DC voltage at the drain of the cascode GGNFET reduces the amount of charge required, from the signal present at the drain of the cascode GGNFET, to reach an equilibrium DC voltage. Thus, effectively reducing the capacitance at the IC pad to that of the diode network.

ESD device 200 may conduct current efficiently only in the direction from the IC pad to ground thus providing ESD protection to the IC only during a positive voltage ESD pulse.

Because ESD device 200 may not conduct current in the direction from ground to the IC pad, it may not provide ESD protection to the IC pad during a negative voltage ESD pulse. Alternate embodiments that may provide ESD protection during a negative voltage ESD pulse are described below.

Figure 3:
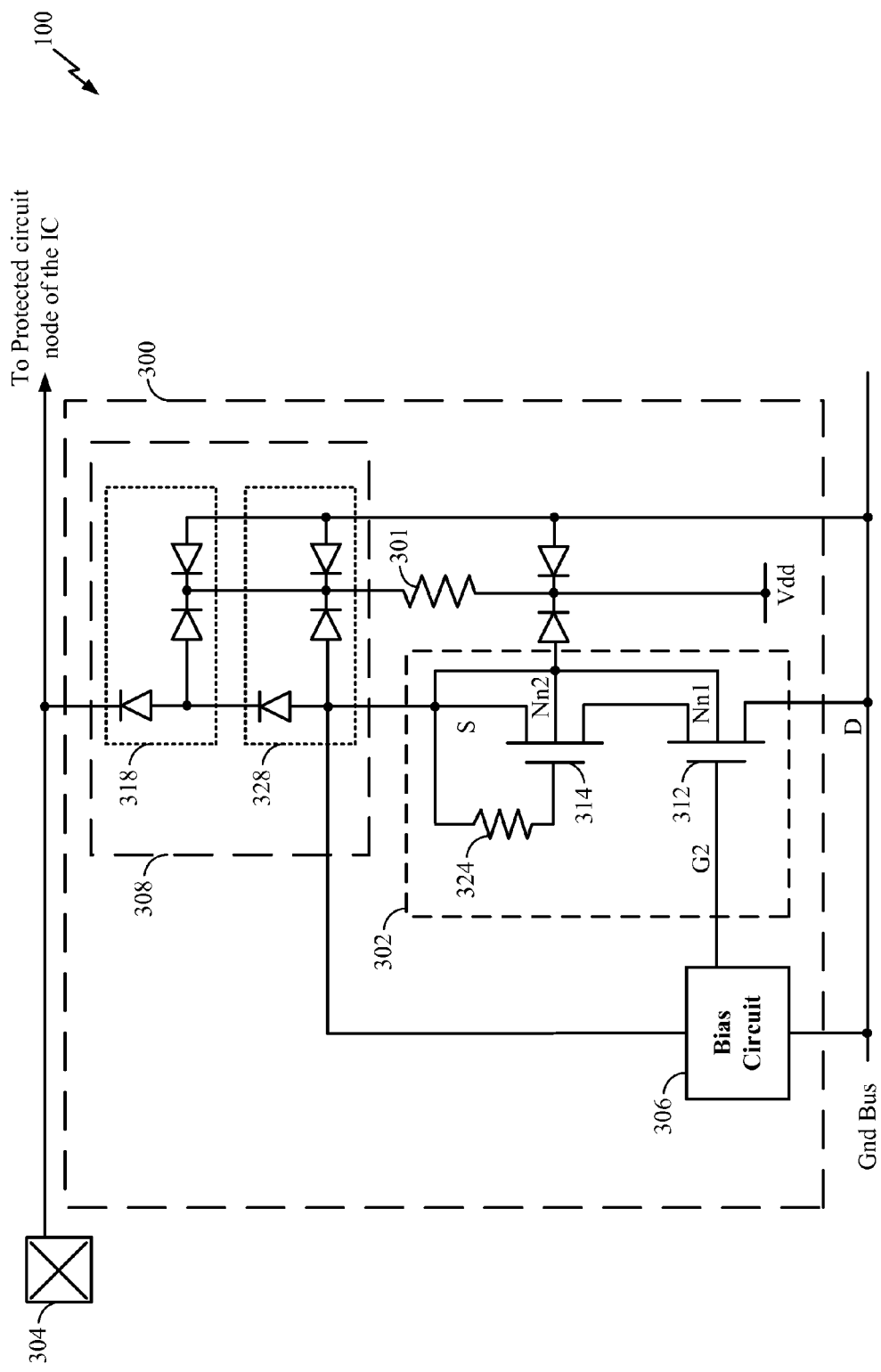
FIG. 3 shows an alternate embodiment of an ESD protection device providing ESD protection during a negative ESD voltage pulse.

FIG. 3 shows an alternate embodiment of an ESD protection device that provides providing ESD protection during a negative voltage ESD pulse. As shown in FIG. 3, ESD protection device 300 comprises bias circuit 306, diode network 308 and cascode grounded gate NFET 302.

Bias circuit 306 has a first terminal coupled to the source, node S, of cascode GGNFET 302, a second terminal coupled to ground and a third terminal coupled to the gate G2 of first NFET 312 of the cascode grounded gate NFET.

Cascode GGNFET 302 comprises of at least two NFET devices, first NFET device 312 (Nn1) and second NFET device 314 (Nn2). First NFET device 312 is cascoded to second NFET device 314. The drain of NFET device 312 is coupled to ground. The gate of first NFET 312 device is coupled to a third terminal of bias circuit 306. The source of first NFET device 312 is coupled to the drain of second NFET device 314. The gate of second device 314 is coupled to source of second NFET device 314 through resistor 324. NFET devices Nn1 and Nn2 are in a triple well process.

Diode network 308 comprises first diode 318 and second diode 328 connected in series. For illustrative purposes only two, 318 and 328, are shown. One skilled in the art may appreciate that any number of diodes connected in series may form diode network 308. Each diode is a N+Pwell diode in deep Nwell. There are applications where the diode network may comprise only one N+Pwell diode.

Cascode GGNFET 302 provides an active discharge path to shunt the current surge from ground to IC pad 304 during a negative voltage ESD pulse. In a similar fashion as in the previous embodiment, diode network 308 reduces the voltage across cascode GGNFET 302 to the level that the cascode GGNFET can withstand without breaking down, or turning on during normal operation, as the signal at IC pad 304 swings below ground. The diode network increases the turn on-voltage of ESD protection device 300 during normal operation and reduces the high capacitive loading presented to IC pad 304 by the cascode GGNFET.

Figure 4:
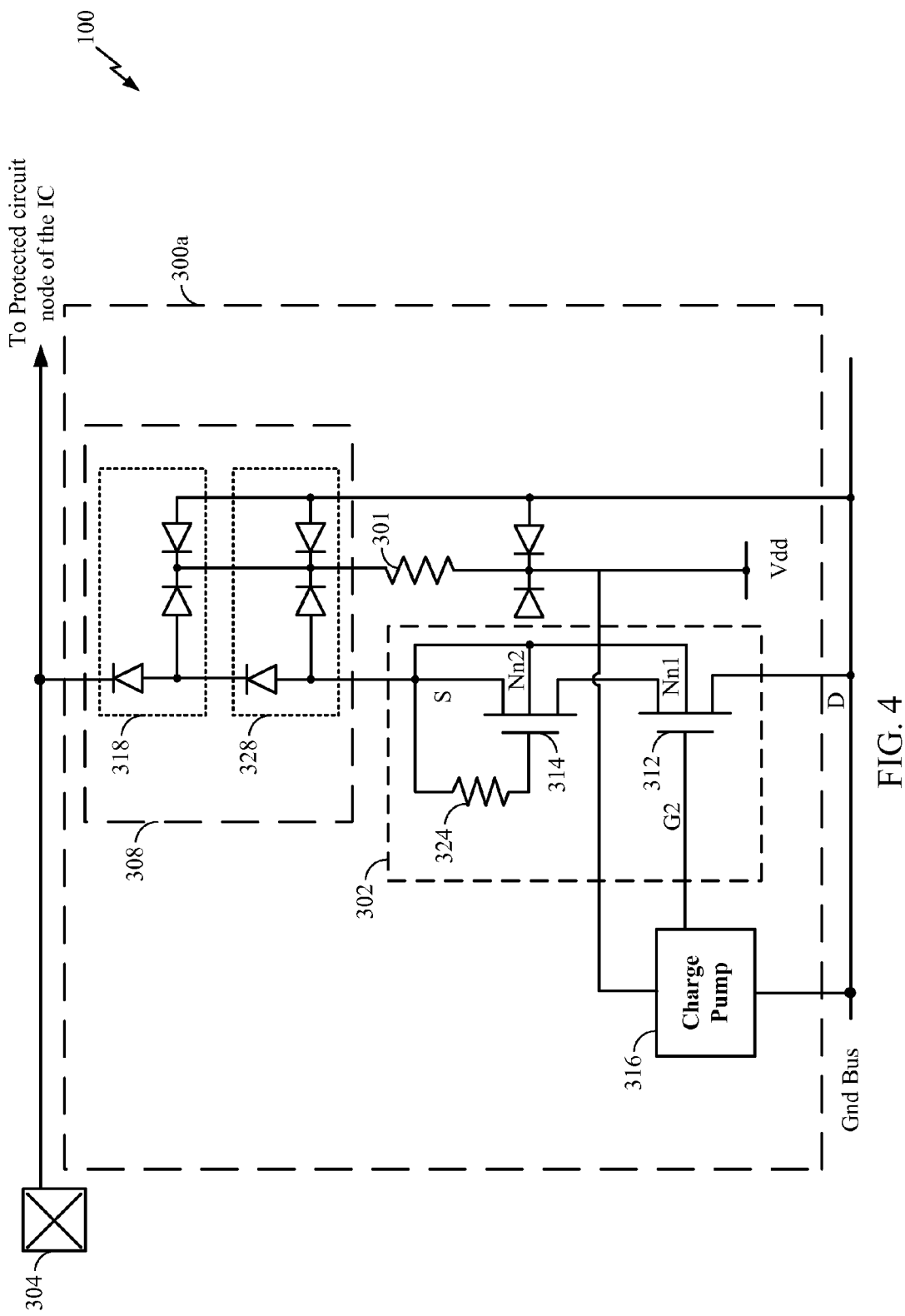
FIG. 4 shows an alternate embodiment for an ESD protection device providing ESD protection during a negative ESD voltage pulse.

A cascode bias is required for the pair of the NFET devices, 312 Nn1 and 314 Nn2. Because the NFET devices are in a triple well process, a negative voltage is required for the cascode bias. The appropriate negative voltage at the gate of the cascode GGNFET ensures the cascode GGNFET remains off during normal operation of the IC. The negative voltage may be generated by either a bias circuit using the RF signal present at the IC pad as shown in the embodiment of FIG. 3, or by using a charge pump as shown in the embodiment of FIG. 4.

It will be also apparent to those skilled in the art that a negative power supply may be used to provide the desired cascode bias voltage, in the case that such a negative power supply is available.

In the exemplary embodiment of FIG. 3, diode network 308 rectifies the RF signal and sets a DC voltage at source, node S, of cascode GGNFET 302. Establishing a DC voltage at the source of cascode GGNEFT 302 reduces the amount of charge required from the signal present at the drain of cascode GGNFET 302 to reach an equilibrium DC voltage. Thus, effectively reducing the capacitance at IC pad 304 to that of diode network 308.

Bias circuit 306 uses the DC voltage at the source of the cascode GGNFET to generate the appropriate negative voltage at the gate, G2, of NFET device Nn1 312.

FIG. 4 shows an alternate embodiment for an ESD protection device providing ESD protection during a negative ESD voltage pulse. As shown in FIG. 4, ESD protection device 300a comprises charge pump circuit 316, diode network 308 and cascode grounded gate NFET 302.

In the exemplary embodiment of FIG. 4, charge pump circuit 316 is used instead of bias circuit 306 to provide the appropriate negative bias voltage at the gate of NFET device 312. Charge pump circuit 316 has a first terminal coupled to the positive power supply Vdd, a second terminal coupled to ground and a third terminal coupled to the gate of NFET 312.

Charge pump circuit 316 operates from positive power supply Vdd to provide the desired cascode bias voltage.

It will be apparent to those skilled in the art that various charge pump circuits may be used to convert a positive voltage of the power supply to a negative voltage, therefore the charge pump circuit implementation is not shown.

Because the load present to the charge pump is a gate capacitance, the charge pump can be designed to consume very little power.

Typically, the deep Nwell terminal of diodes 318 and 328 is connected to the positive supply Vdd to reverse bias the parasitic diodes of devices 318 and 328 (formed between their PWell junction and the Nwell).

Figure 5:
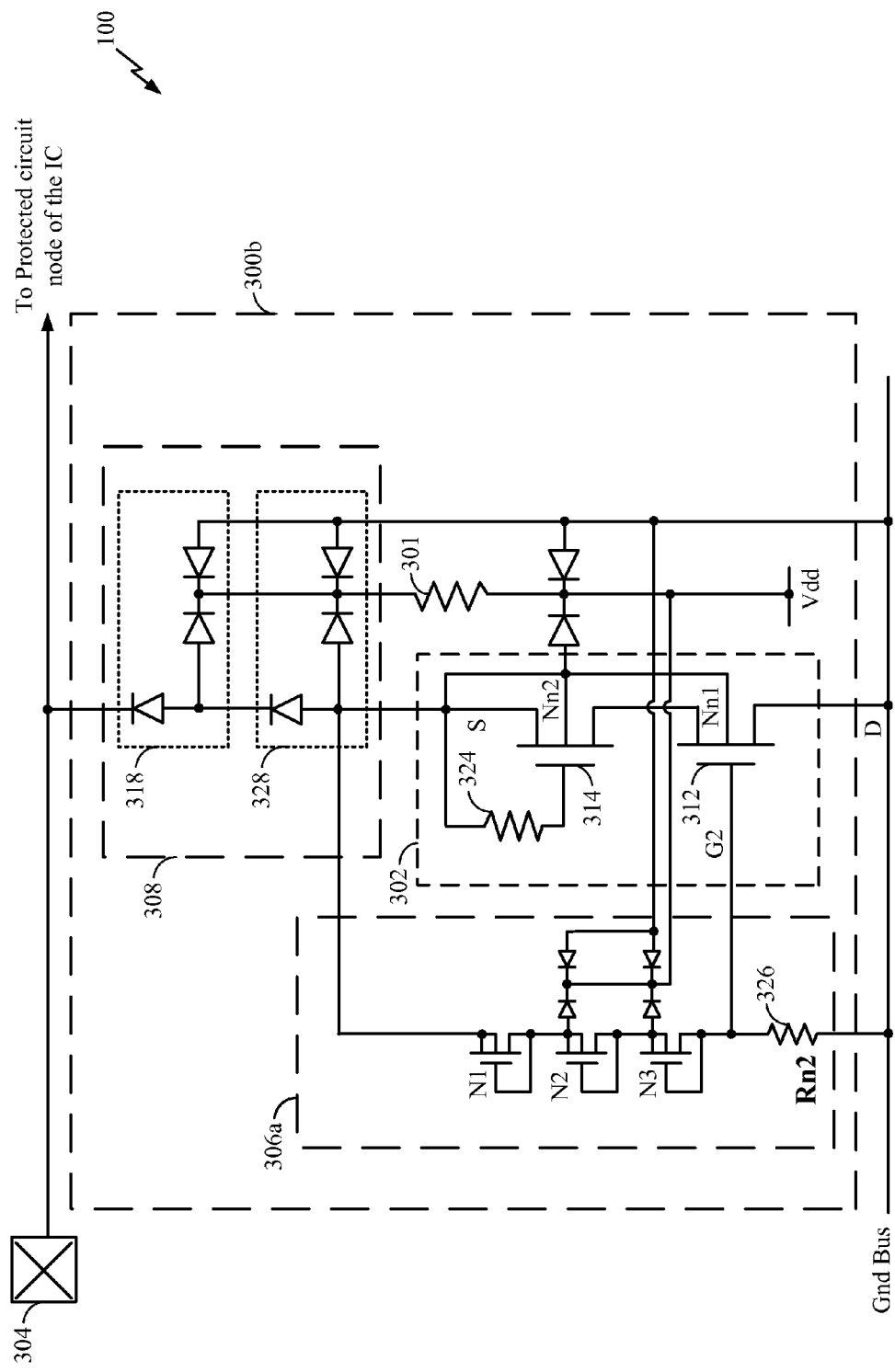
FIG. 5 shows an exemplary embodiment of the ESD protection device shown in FIG. 3.

FIG. 5 shows an exemplary embodiment of the ESD protection device shown in FIG. 3. In the exemplary embodiment shown in FIG. 5, bias circuit 306a comprises a plurality of NFETs (3 shown) and a resistor. The plurality of the NFETs are connected in series and they are manufactured in Deep Nwell (N1, N2, and N3).

The NFETs are in a diode-connected configuration and offer a low impedance from the gate of cascode GGNFET 302 to the source of the cascode GGNFET. As the source of cascode GGNFET is being powered up by the RF signal, the cascode bias voltage at the gate of the cascode GGNFET rapidly follows the bias voltage at the source of the cascode GGNFET. The bias voltage with respect to the source of the cascode NFET is approximately 3 times the NFET threshold voltage (Vt) drop. The DC current of the bias circuit is set by the bias voltage at the source of the cascode GGNFET minus the sum of 3 times Vt drop of N1–N3 divided by the value of resistor Rn2 326. The number of diode connected NFETs is appropriately selected to generate the desired negative voltage for the cascode NFET.

During pulsed positive ESD testing of ESD devices shown in FIG. 3, FIG. 4 and FIG. 5 it was found that the N+/Pwell junction of diode 328 would avalanche through a forward biased Pwell/Deep Nwell junction to the Vdd node, which is held at ground during the ESD testing. As a result, diode 328 would rupture before the desired trigger voltage that the ESD device could reach. The failure voltage of the N+/Pwell junction of diode 328 may be improved by placing resistor 301 in series with the deep Nwell terminal and the positive supply Vdd. As a result, the failure voltage can be increased by the product of the current expected during a failure and the resistance value of resistor 301.

Figure 6:
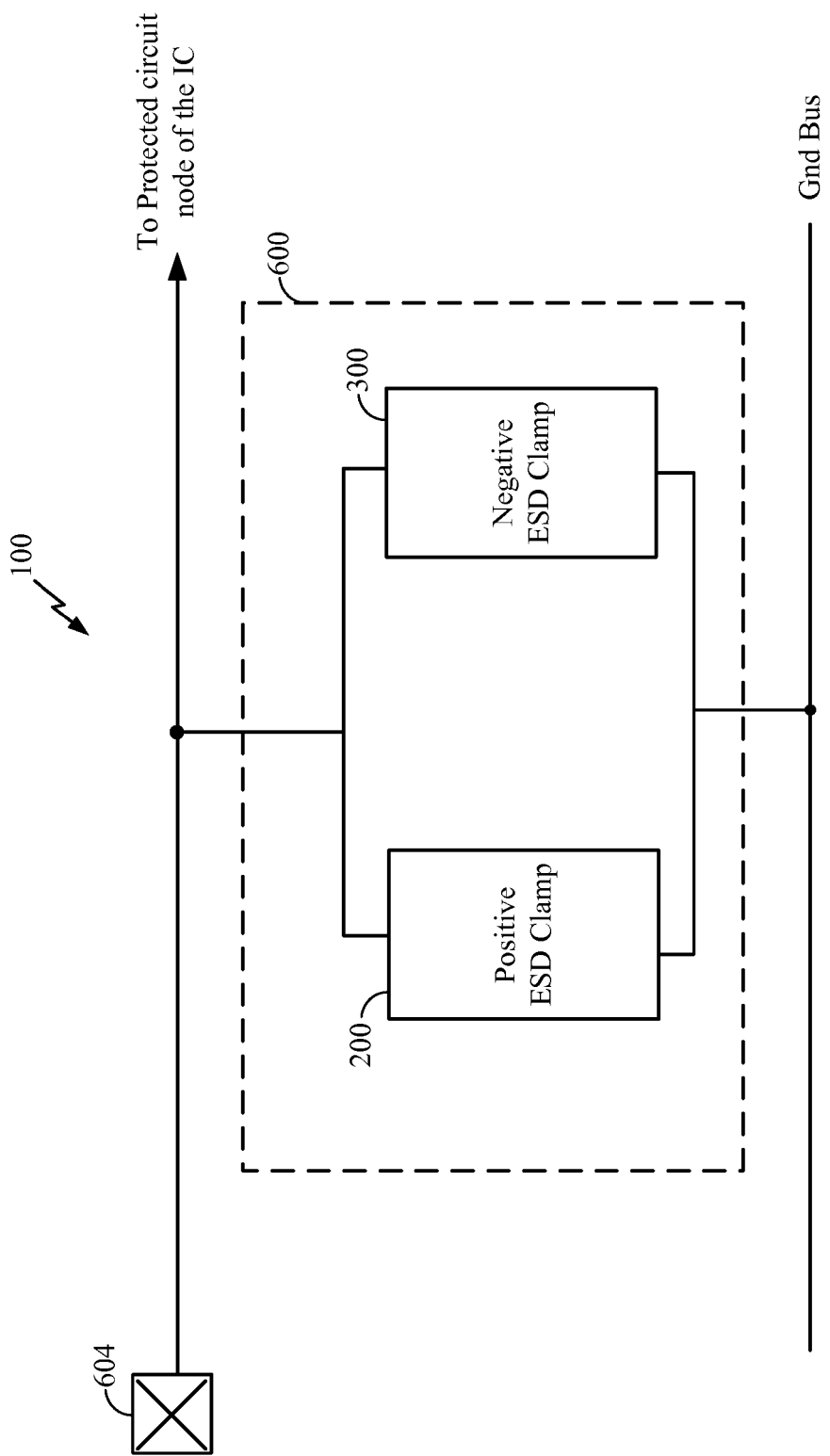
FIG. 6 shows a bi-directional ESD protection device providing protection during positive and negative ESD voltage pulses.

FIG. 6 shows a bi-directional ESD protection device providing protection during positive and negative ESD voltage pulses. ESD protection device 600 comprises positive ESD clamp 200 and negative ESD clamp 300. Positive ESD clamp 200 is connected in parallel with negative ESD Clamp 300. Positive ESD clamp 200 provides protection during positive ESD pulses and it comprises the ESD protection circuit of FIG. 2. Negative ESD clamp 300 provides ESD protection during negative ESD pulses. It will be apparent to those of skill in the art that any of the exemplary embodiments presented in FIG. 3, FIG. 4 and FIG. 5 may be used as a negative ESD clamp.

The present embodiments are described with reference to CMOS devices. However, those of ordinary skill in the art will appreciate that the invention maybe be applied to Bipolar, BiCMOS, SiGe BiCMOS, and other processes that are susceptible to damage caused by ESD. The present invention includes various embodiments of an ESD protection device having a turn-on voltage and high current clamping characteristics such that ESD transient voltages will be properly limited to not damage any gate oxide or other vulnerable semiconductor device.

Figure 7:
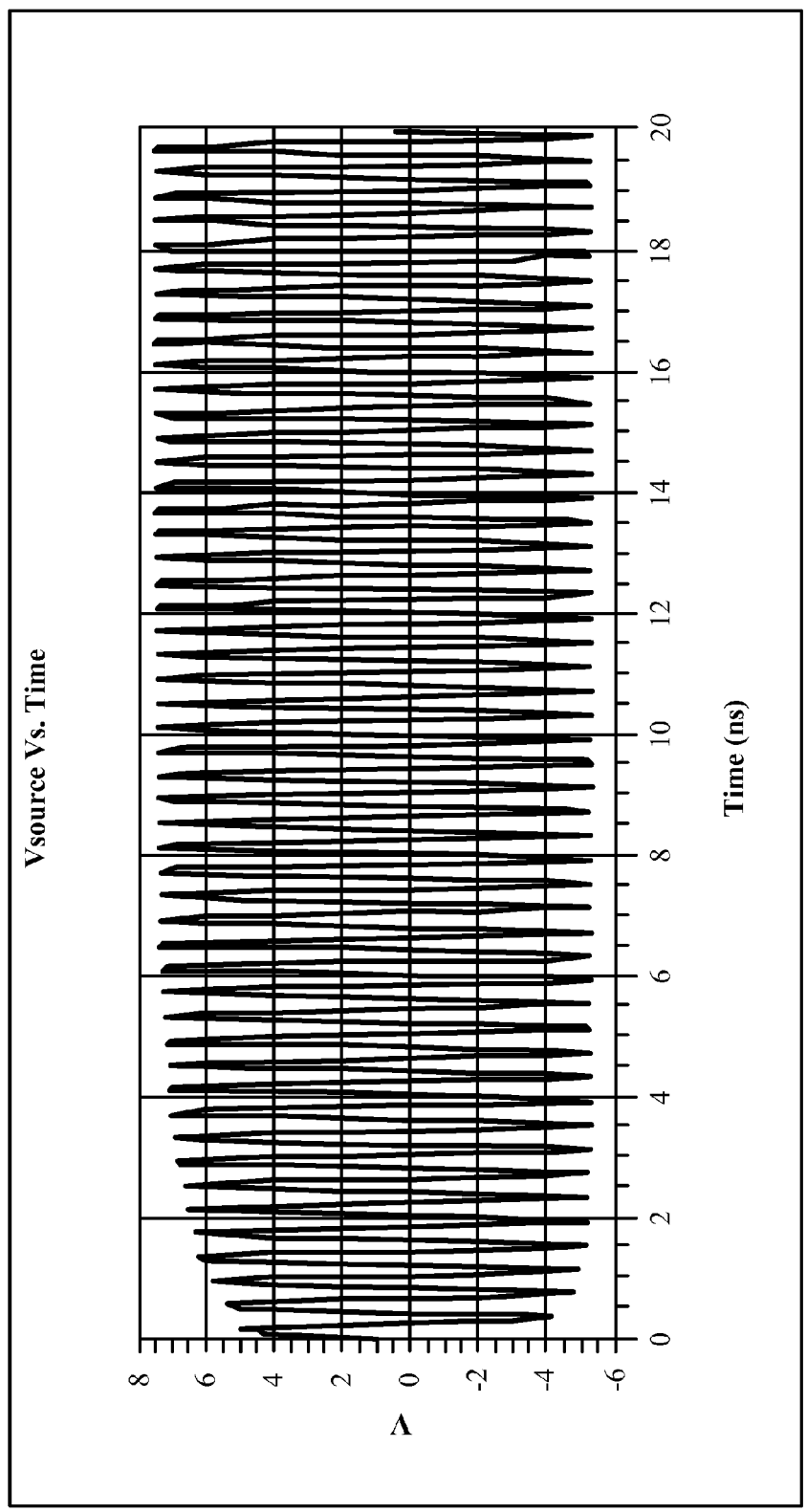
FIG. 7 shows an exemplary electrical simulation of the voltage at the IC pad with: (i) a sine wave voltage applied to the IC Pad, (ii) a positive ESD clamp as in the embodiment shown in FIG. 2 and (iii) a negative ESD clamp as in the embodiment shown in FIG. 5.

FIG. 7 shows an exemplary electrical simulation of the voltage at the IC pad with: (i) a sine wave voltage applied to the IC Pad, (ii) a positive ESD clamp as in the embodiment shown in FIG. 2 and (iii) a negative ESD clamp as in the embodiment shown in FIG. 5. The positive ESD clamp and the negative ESD clamp are connected in parallel.

The radio frequency (RF) signal source resistance was set to 50Ω. The amplitude of the RF signal was set to 6.5V and the DC offset voltage was set to 1.1V. The frequency was set at 2.5 GHz. Note that for a few cycles there is a brief transient, attributable to partially charging the drain, node D, of cascode GGNFET of ESD protection device 200, and to completely charging the source, node S, of cascode GGNFET of ESD protection device 300. After a few cycles a steady state is reached.

Figure 8:
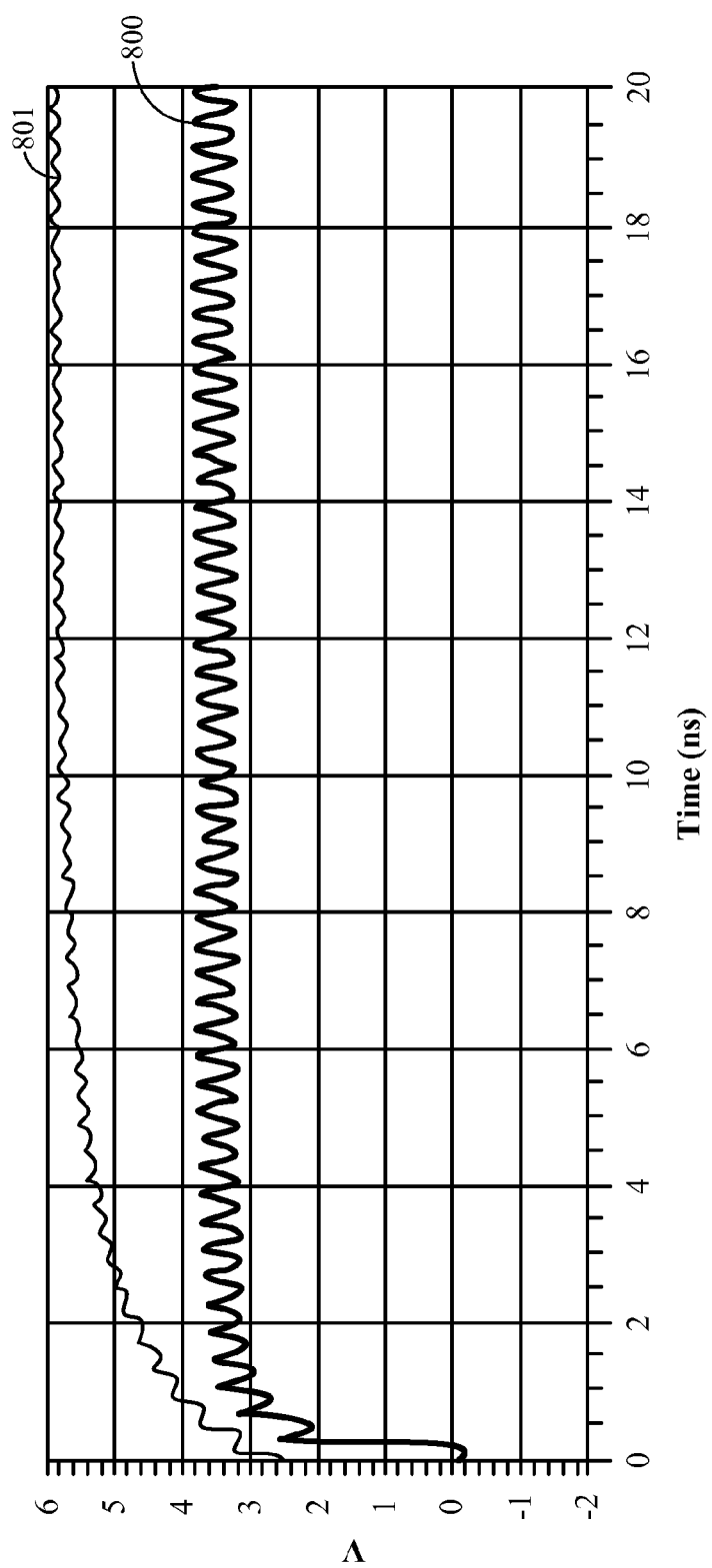
FIG. 8 shows the bias voltage of drain node D of FIG. 5 and of source node S of ESD protection device of FIG. 5.

FIG. 8 shows the bias voltage of drain node D of FIG. 5 and of source node S of ESD protection device of FIG. 5. Curve 800 shows the bias voltage at the drain node D. And curve 801 shows the bias voltage at the source node S. Note that the voltages are well below the maximum break down voltage of the cascode GGNFET, which is 7.2V for the examples presented.

Figure 9:
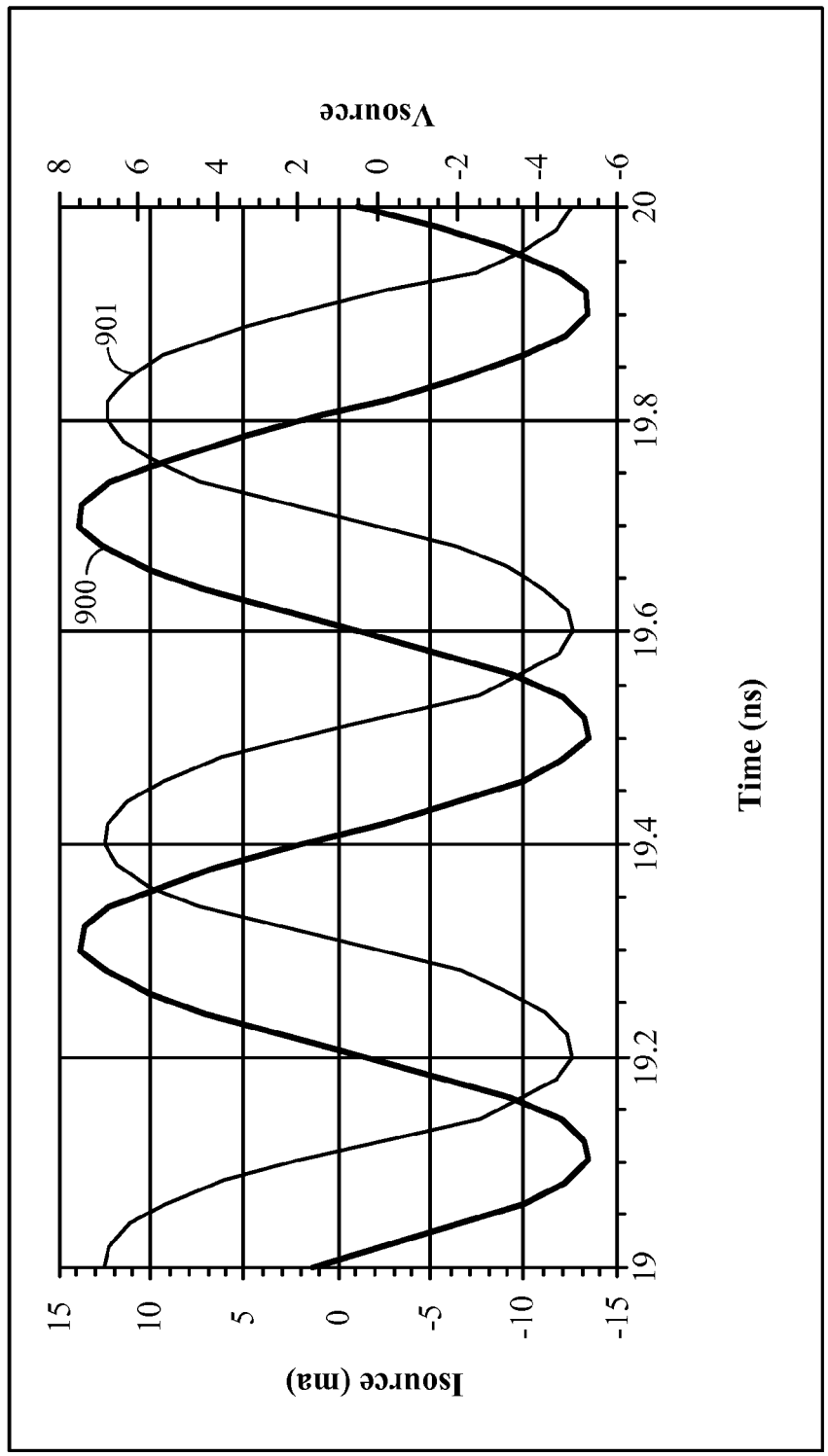
FIG. 9 shows the steady state voltage and current waveforms at the IC pad.

FIG. 9 shows the steady state voltage and current waveforms at the IC pad. Curve 900 shows the steady state voltage waveform and curve 901 shows the steady state current waveform. Note that the current is approximately 90 degrees out of phase with the voltage, which is a consequence of the predominately capacitive load of the two ESD clamps. The effective capacitance is calculated to be 125 fF.

Figure 10:
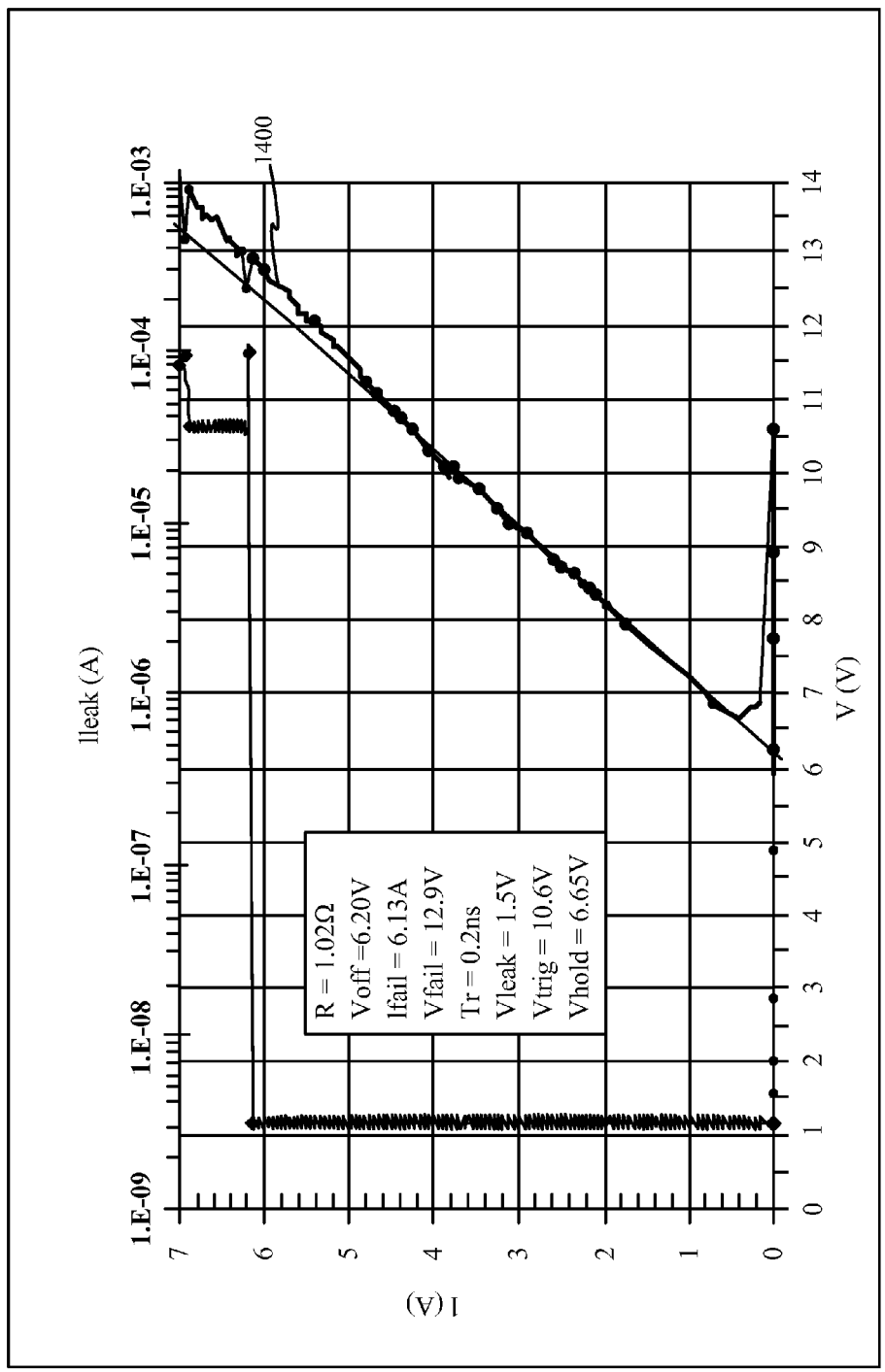
FIG. 10 shows measured transmission line pulse (TLP) plots of a manufactured bi-directional ESD protection device comprising the exemplary ESD protection devices shown in FIGS. 2 and 5, for a positive ESD pulse

FIG. 10 shows measured transmission line pulse (TLP) plots of a manufactured bi-directional ESD protection device comprising the exemplary ESD protection devices shown in FIGS. 2 and 5, for a positive ESD pulse.

Figure 11:
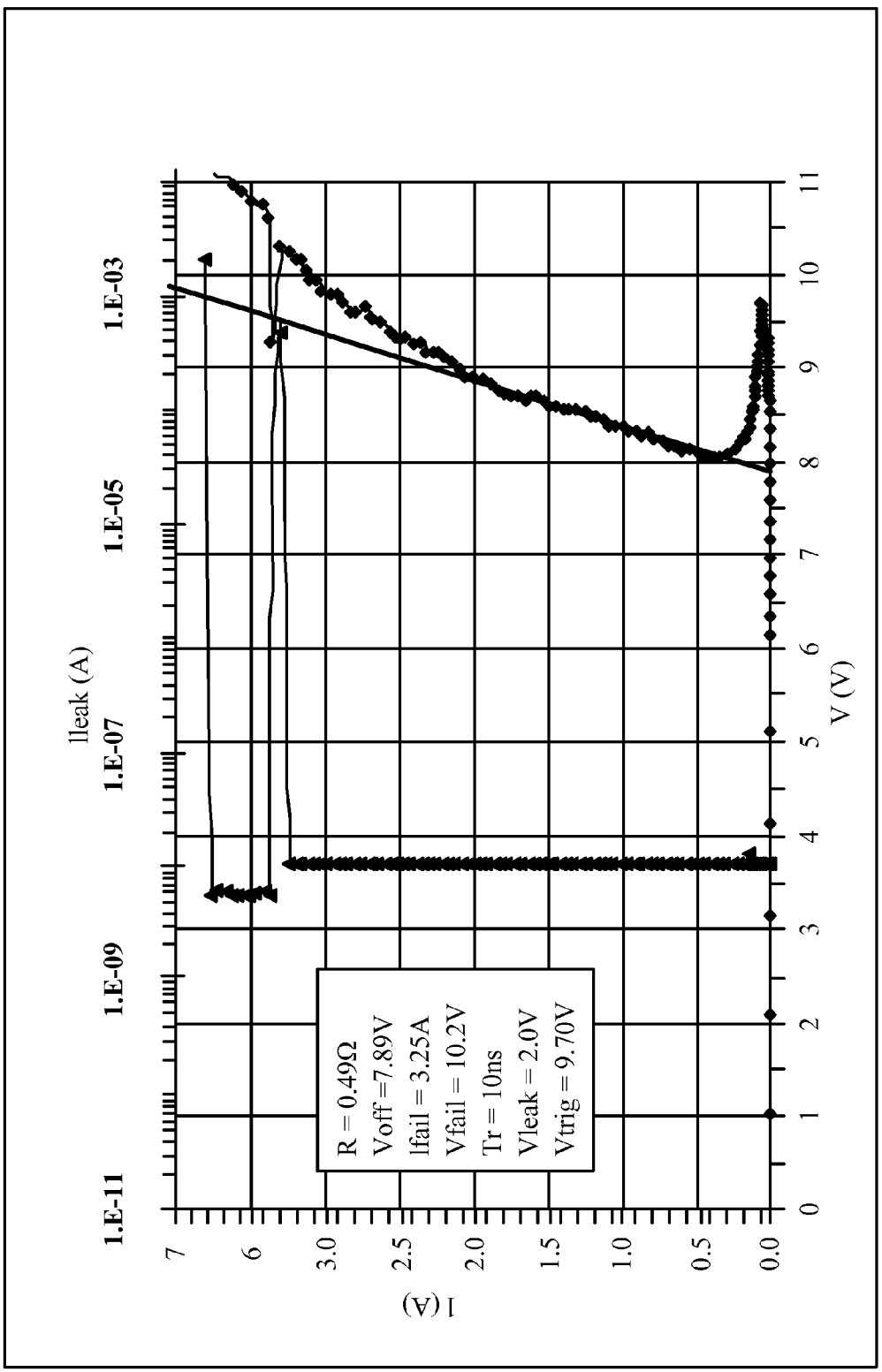
FIG. 11 shows measured transmission line pulse (TLP) plots of a manufactured bi-directional ESD protection device comprising the exemplary ESD protection devices shown in FIGS. 2 and 5, for a negative ESD pulse.

FIG. 11 shows measured transmission line pulse (TLP) plots of a manufactured bi-directional ESD protection device comprising the exemplary ESD protection devices shown in FIGS. 2 and 5, for a negative ESD pulse.

The TLP used for the measurements had a pulse width of 100 ns. The conversion factor between TLP failure current and human body model (HBM) failure voltage is about 2 kV HBM/A TLP. Thus, this composite clamp is more than adequate for the industry wide common specification of 2 kV HBM.

Figure 12:
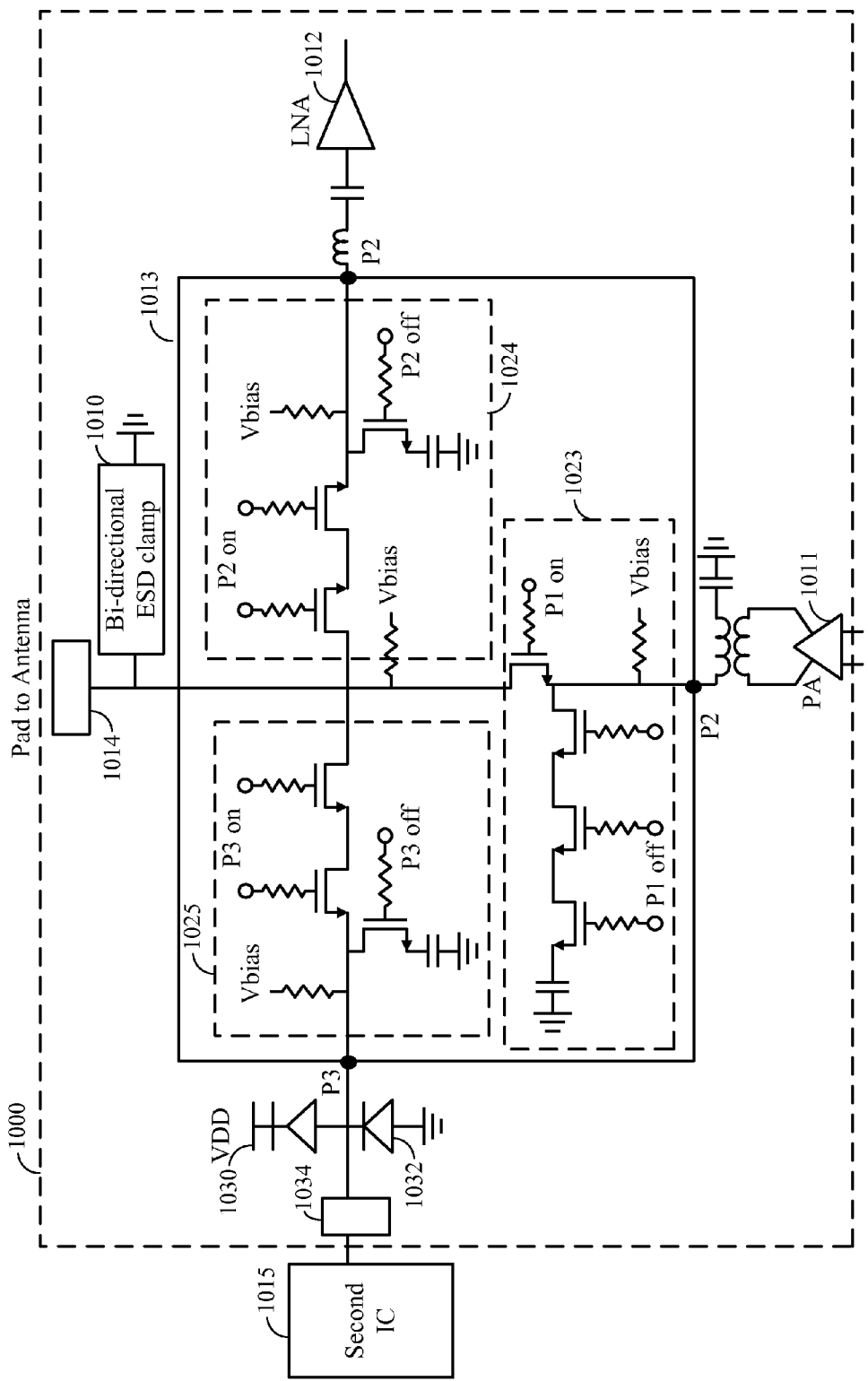
FIG. 12 shows an IC having an IC pad coupled to an integrated Single-Pole-Triple-Throw (SP3T) RF front-end (RFFE) switch.

FIG. 12 shows an IC having an IC pad coupled to an integrated Single-Pole-Triple-Throw (SP3T) RF front-end (RFFE) switch. The IC pad is protected by a bi-directional ESD clamp. Bi-directional ESD clamp 1010 is coupled to IC pad 1014 to provide protection to IC 1000 during either a positive or a negative voltage ESD pulse applied at IC pad 1014. Bi-directional clamp 1010 comprises a device such as device 600 of FIG. 6.

The IC Pad is coupled to integrated power amplifier 1011, integrated low noise amplifier 1012 and a second IC 1015 through RF front-end (RFFE) switch 1013. RFFE switch 1013 is a single pole triple throw (SP3T) switch and comprises transmit path 1023, receive path 1024 and second IC path 1025. RFFE switch 1013 is a single pole having three ports, Port-1 (P1), Port-2 (P2) and Port-3 (P3), respectively associated with transmit path 1023, receive path 1024 and second IC path 1025.

Transmit path 1023 has a first terminal coupled to PA 1011, a second terminal coupled to IC pad 1014 and a third terminal coupled to ground. Receive path 1024 has a first terminal coupled to LNA 1012, a second terminal coupled to IC pad 1014 and a third terminal coupled to ground. Second IC path 1025 has a first terminal coupled to second IC pad 1034, a second terminal coupled to IC pad 1014 and a third terminal coupled to ground. Second IC pad 1034 is coupled to negative ESD diode 1032 and to positive ESD diode 1030.

In certain situations, it is desirable to further reduce the parasitic capacitance presented by bi-directional ESD clamp 1010 to improve the RF performance of the RF circuits coupled to the IC pad through the RFFE switch.

Further reduction of the parasitic capacitance may be possible if only a positive ESD clamp, such as ESD device 200 of FIG. 2, is used to provide ESD protection either to the IC pad coupled to the RFFE switch, or to the second IC pad or to both. When only one ESD clamp is coupled to an IC pad the parasitic capacitance is reduced significantly.

Figure 13:
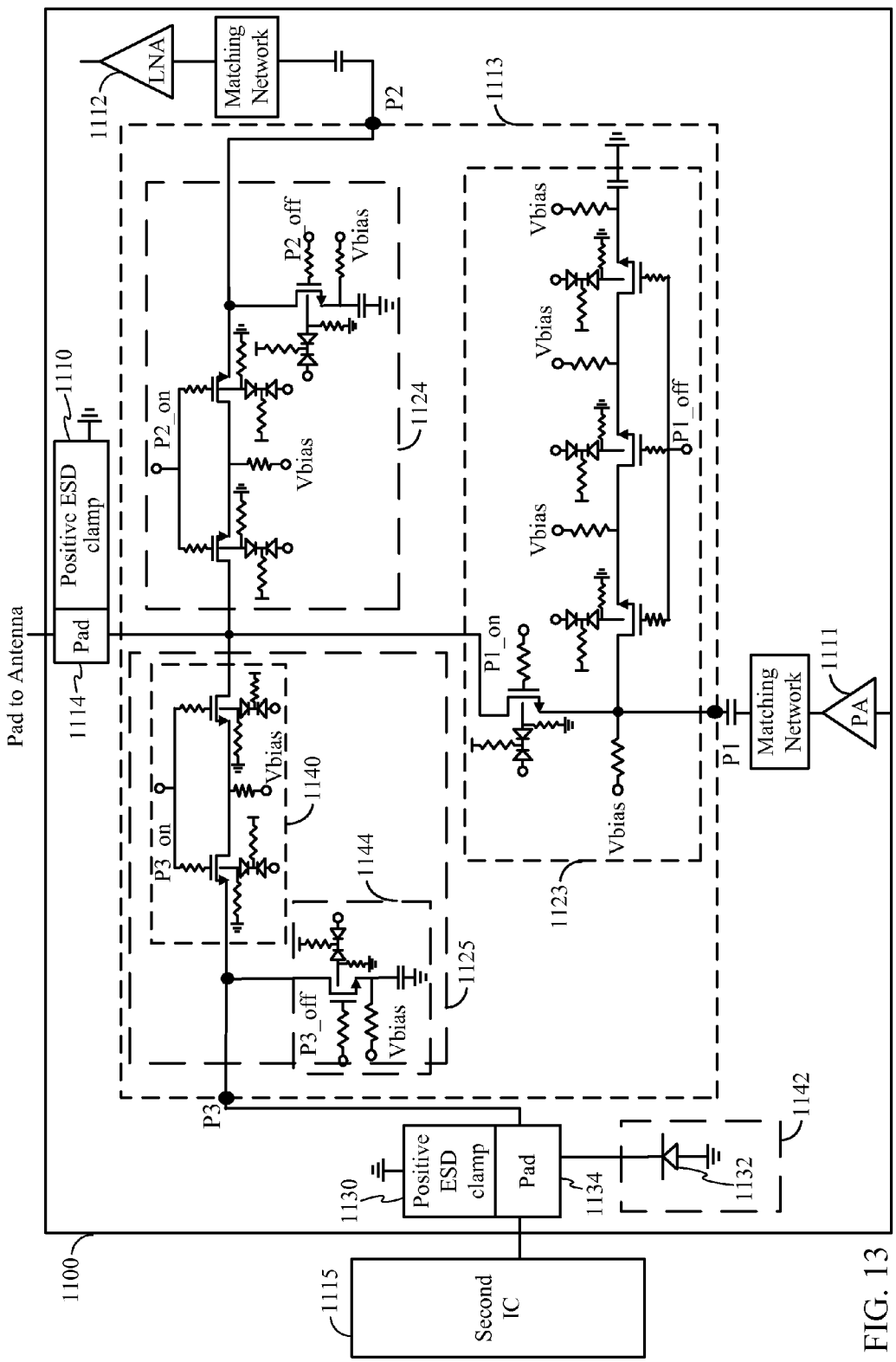
FIG. 13 shows an exemplary embodiment of ESD protection for an IC, having an IC pad coupled to an RFFE switch.

FIG. 13 shows an exemplary embodiment of ESD protection for an IC, having an IC pad coupled to an RFFE switch.

IC pad 1114 is coupled to positive ESD clamp 1110. The IC pad is further coupled through RF front-end (RFFE) switch 1113 to integrated power amplifier 1111, integrated low noise amplifier 1112 and a second IC 1115. RFFE switch 1113 is a single pole triple throw (SP3T) switch and comprises transmit path 1123, receive path 1124 and second IC path 1125. Second IC path 1125 comprises series switch 1140 and shunt switch 1144. Series switch 1140 has one terminal coupled to IC pad 1114 and a second terminal coupled to second IC pad 1134.

RFFE switch 1113 is a single pole having three ports, Port-1 (P1), Port-2 (P2) and Port-3 (P3), respectively associated with transmit path 1123, receive path 1124 and second IC path 1125.

Transmit path 1123 has a first terminal coupled to PA 1111, a second terminal coupled to IC pad 1114 and a third terminal coupled to ground. Receive path 1124 has a first terminal coupled to LNA 1112, a second terminal coupled to IC pad 1114 and a third terminal coupled to ground. Second IC path 1125 has a first terminal coupled to second IC pad 1134, a second terminal coupled to IC pad 1114 and a third terminal coupled to ground. Second IC pad 1134 is coupled to positive ESD clamp 1130 and to ESD protection circuit 1142. Each of positive ESD clamp 1110 and 1130 comprises an ESD device such as device 200 of FIG. 2.

Positive ESD clamp 1110 provides ESD protection to IC 1100 during a positive ESD voltage pulse applied at IC pad 1114. However, ESD device 200 of FIG. 2 may not conduct current efficiently in the direction from ground to IC pad 1114, thus it may not provide ESD protection to the IC during a negative voltage ESD voltage. ESD protection for negative voltage ESD pulses is provided by a low impedance path that is formed from IC pad 1114 to the ground of negative ESD diode 1132.

The low impedance path comprises series switch 1140 and ESD protection circuit 1142. ESD protection circuit 1142 comprises ESD diode 1132 having an anode coupled to ground and a cathode connected to IC pad 1134.

During a negative voltage ESD pulse, IC pad 1114 is at a lower potential than ground. As a result, series switch 1140 of second IC path 1125 turns on and provides a low impedance path from ground via ESD diode 1132. Therefore, the ESD current can flow from ground via the ESD diode during a negative ESD voltage pulse.

Figure 14:
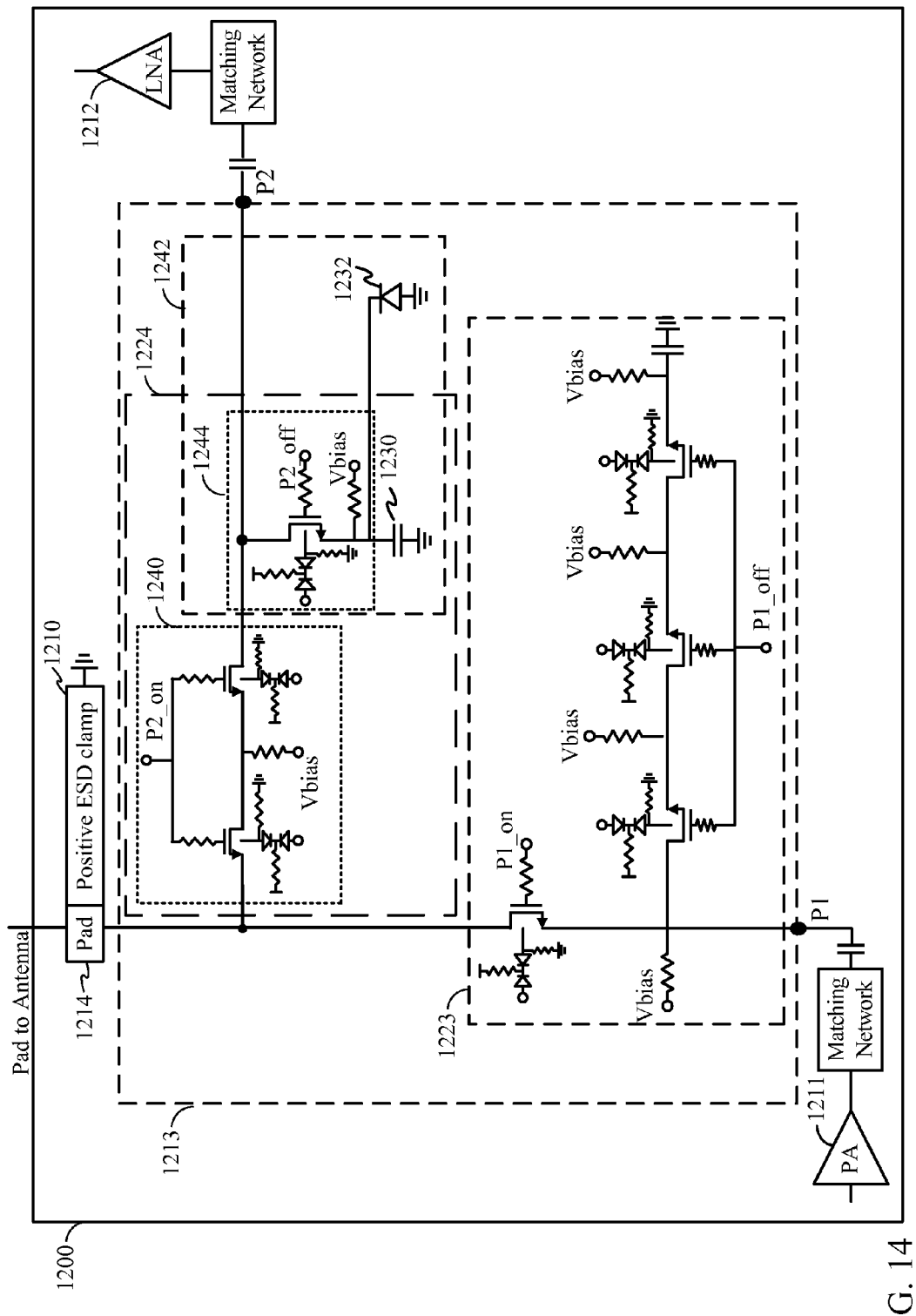
FIG. 14 shows an alternate embodiment of ESD protection for an IC, having an IC pad coupled to an RFFE switch.

In the case that no path of the RFFE switch is coupled to ground through the ESD protection circuit, such as an ESD diode, an ESD diode may be appropriately connected to a shunt path of the RFFE switch to form an ESD protection circuit as shown in FIG. 14, and described below.

FIG. 14 shows an alternate embodiment of ESD protection for an IC, having an IC pad coupled to an RFFE switch.

IC pad 1214 is coupled to positive ESD clamp 1210. The IC pad is further coupled to integrated power amplifier 1211, integrated low noise amplifier 1212 through RF front-end (RFFE) switch 1213. RFFE switch 1213 is a single pole double throw (SP2T) switch and comprises transmit path 1223 and receive path 1224. Receive path 1224 comprises series switch 1240 and shunt switch 1244. Shunt switch 1244 is coupled to ground through capacitor 1230.

RFFE switch 1213 is a single pole having two ports, Port-1 (P1) and Port-2 (P2), respectively associated with transmit path 1223 and receive path 1224.

Transmit path 1223 has a first terminal coupled to PA 1211, a second terminal coupled to IC pad 1214 and a third terminal coupled to ground. Receive path 1224 has a first terminal coupled to LNA 1212, a second terminal coupled to IC pad 1214 and a third terminal coupled to ground.

Positive ESD clamp 1210 comprises an ESD device such as ESD device 200 FIG. 2.

Positive ESD clamp 1210 provides ESD protection to IC 1200 during a positive voltage ESD pulse applied at IC pad 1214. However, ESD device 200 of FIG. 2 may not conduct current efficiently in the direction from ground to IC pad 1214, thus it may not provide ESD protection to the IC during a negative voltage ESD pulse.

ESD protection for a negative voltage ESD pulse is provided by connecting series switch 1240 to ESD protection circuitry 1242. ESD protection circuit 1242 includes shunt switch 1244 coupled to an ESD diode 1232. ESD diode 1232 has an anode coupled to ground and a cathode coupled to shunt switch 1244. During a negative voltage ESD pulse, IC pad 1214 is at a lower potential than ground. As a result, series switch 1240 and shunt switch 1244 turn on to provide a low impedance path to the IC pad from ground via ESD diode 1232. Therefore, the ESD current can flow from ground, via the ESD diode, during the negative voltage ESD pulse.

Those of skill would further appreciate that the proposed solution presented with reference to FIG. 13 and FIG. 14 is not limited to SP3T and SP2T type RFFE switches. The proposed ESD protection solution may provide ESD protection to an IC having an IC pad coupled to a RFFE switch, where the RFFE switch comprises any number of paths with their respective ports.

Figure 15:
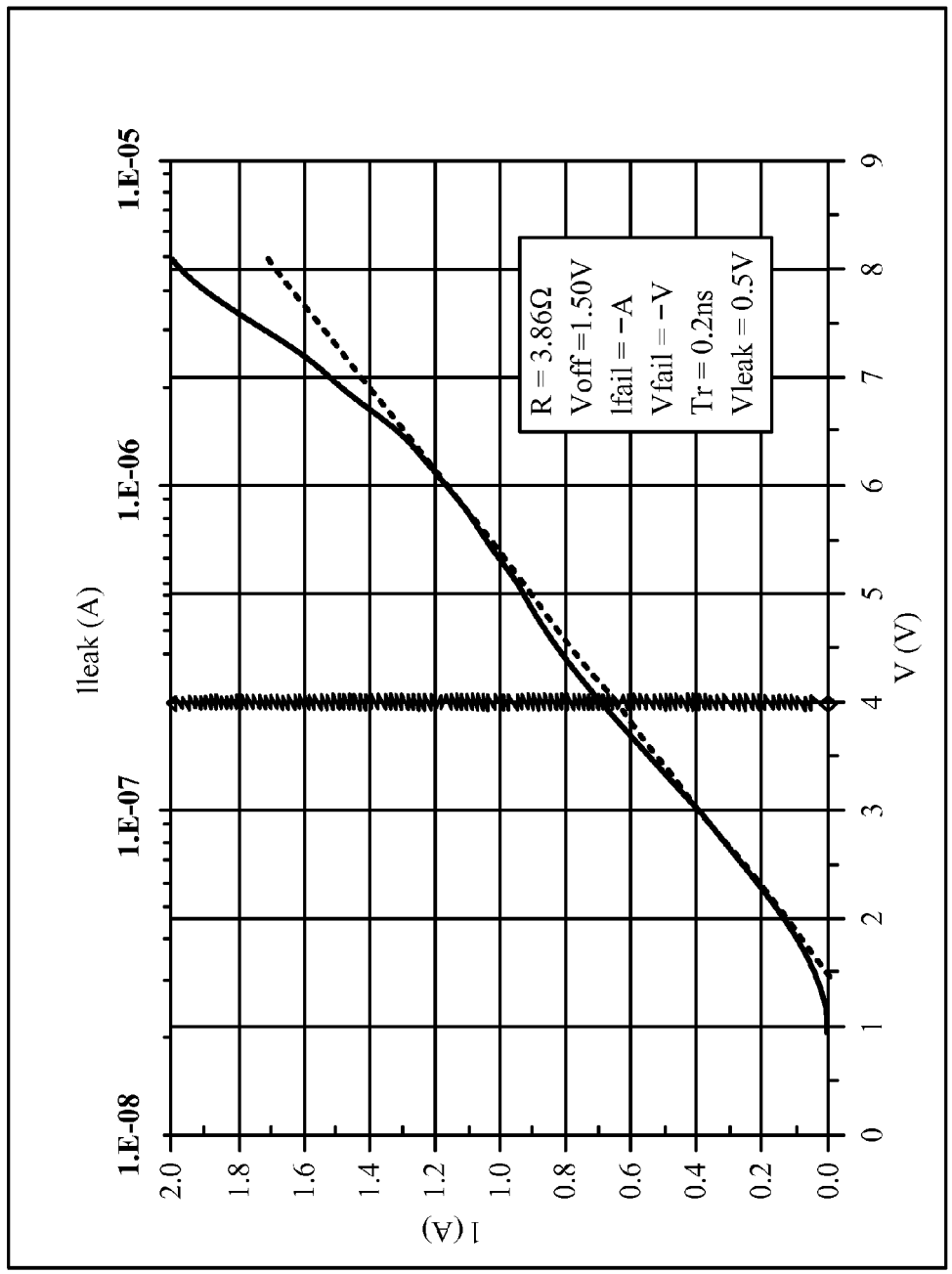
FIG. 15 shows measured transmission line pulse (TLP) plots of a manufactured IC for negative voltage ESD pulses.

FIG. 15 shows measured transmission line pulse (TLP) plots of a manufactured IC for negative voltage ESD pulses. The TLP used for the measurements had a pulse width of 100 ns. It is noted that the voltage and current are plotted as absolute values and are actually negative with respect to ground. TLP measurement for positive ESD pulses have demonstrated the same results as the results shown in FIG. 10, because the ESD protection is mainly due to the positive ESC clamp.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A device including a cascode grounded gate NFET, for providing protection to an integrated circuit (IC) against positive voltage ESD pulses, comprising:
   a diode network, coupled between an IC pad of the IC and a drain of the cascode grounded gate NFET, where the diode network sets the turn-on voltage of the device at a desired level; and
   a precharge circuit, to set the bias voltage at the drain of the cascode grounded gate NFET at a desired level in order to reduce the capacitive loading at the IC pad, where the precharge circuit comprises a diode having an anode coupled to a positive supply and a cathode coupled to the drain of the cascode grounded gate NFET and to the diode network.

2. The device of claim 1, where the diode network comprises at least a first diode having a cathode coupled to the drain of the cascode grounded gate NFET and an anode coupled to the IC pad of the IC.

3. The device of claim 2, where the diode network comprises a plurality of diodes connected in series, having an anode of the first diode coupled to the IC pad of the IC, and a cathode of the last diode coupled to the drain of the cascode grounded gate NFET.

4. The device of claim 3, where the diodes are P+NWell diodes.

5. The device of claim 1, where the cascode grounded gate NFET comprises at least a first NFET and a second NFET in cascode configuration, and where the gate of the first NFET is coupled to ground through a first resistor, the drain of the first NFET is coupled to the source of the second NFET, the drain of the second NFET is coupled to the diode network and the gate of the second NFET is coupled to power supply through a second resistor.

6. The device of claim 1, further comprising a charge pump for biasing a gate of one of the transistors of the cascode grounded gate NFET.

7. A device including a cascode grounded gate NFET, for providing protection to an IC against negative voltage ESD pulses, comprising:
   a diode network, coupled between an IC pad of the IC and the source of the cascode grounded gate NFET, where the diode network sets the turn-on voltage of the device at a desired level; and
   a bias circuit, to set a desired negative voltage level at the gate of the cascode grounded gate NFET,
   where the cascode grounded gate NFET comprises at least a first NFET and a second NFET in cascode configuration, and where the bias circuit has a first terminal coupled to the source of the second NFET, a second terminal coupled to ground and a third terminal coupled to the gate of the first NFET, the third terminal providing a desired negative voltage level to the gate of the first NFET.

8. The device of claim 7, where the diode network comprises at least a first diode having an anode coupled to the source of the cascode grounded gate NFET and a cathode coupled to the IC pad of the IC.

9. The device of claim 8, where the diode network comprises a plurality of diodes connected in series having an anode of the diode first in the series coupled to the source of the cascode grounded gate NFET and a cathode of the diode last in the series coupled to the IC pad of the IC.

10. The device of claim 7, where the bias circuit is a charge pump circuit for setting a desired negative voltage level at the gate of the first NFET.

11. The device of claim 7, where the bias circuit comprises a plurality of NFET devices in a series connection and a resistor, where each NFET device is configured as a diode, having a first NFET device coupled to the source of the second NFET of the cascode grounded gate NFET, the NFET device last in the series connection coupled to the gate of the first NFET of the cascode grounded gate NFET and to a first terminal of the resistor, and the second terminal of the resistor coupled to ground.

12. A device including a cascode grounded gate NFET, for providing protection to an IC against negative voltage ESD pulses, comprising:

a diode network, coupled between an IC pad of the IC and the source of the cascode grounded gate NFET, where the diode network sets the turn-on voltage of the device at a desired level; and
a bias circuit, to set a desired negative voltage level at the gate of the cascode grounded gate NFET,
where the diode network comprises a plurality of diodes connected in series having an anode of the diode first in the series coupled to the source of the cascode grounded gate NFET and a cathode of the diode last in the series coupled to the IC pad of the IC, and
where the diodes are N+Pwell diodes having the Deep Nwell terminal coupled to a positive supply through a resistor.

13. A device comprising:
a first ESD clamp for providing protection to an IC against ESD charges caused by positive voltage ESD pulses, having a cascode grounded NFET (202), a precharge circuit and a diode network, where the diode network is coupled between an IC pad of the IC and a drain node of the cascode grounded gate NFET, and where the first ESD clamp provides an electrical path for the ESD charge to discharge from the IC pad to ground; and
a second ESD clamp coupled in parallel to the first ESD clamp, for providing protection to the IC against ESD charges caused by negative voltage ESD pulses, having a cascode grounded gate NFET, a bias circuit and a diode network ,
where the diode network is coupled between an IC pad of the IC and a source of the cascode grounded gate NFET, and where the second ESD clamp provides an electrical path for the ESD charge to discharge from ground to IC pad, and
where the precharge circuit comprises a diode having an anode coupled to a positive supply and a cathode coupled to the drain of the cascode grounded gate NFET and to the diode network.

14. The device of claim 13, where the bias circuit sets a desired negative voltage at the gate of the cascode grounded gate NFET of the second ESD clamp.

15. An IC including an IC pad coupled to an RF front-end (RFFE) switch, comprising:
an ESD clamp having a cascode grounded gate NFET, a precharge circuit and a diode network to set the turn-on voltage of the ESD clamp at a desired level, where the diode network is coupled between the IC pad of the IC and a drain of the cascode grounded gate NFET, and where the ESD clamp provides protection to the IC against charges caused by positive voltage ESD pulses by providing an electrical path for the ESD charge to discharge from the IC pad to ground; and
an ESD protection circuit coupled between ground and a series switch of the RFFE switch to provide an electrical path for the ESD charge to discharge to the IC pad from ground for protecting the IC against negative voltage ESD pulses,
where the precharge circuit comprises a diode having an anode coupled to a positive supply and a cathode coupled to the drain of the cascode grounded gate NFET and to the diode network.

16. The IC of claim 15, where the ESD protection circuit is an ESD diode having an anode coupled to ground and a cathode coupled to the series switch.

17. The IC of claim 15, where the ESD protection circuit comprises a shunt switch of the RFFE switch coupled to an ESD diode, the ESD diode having an anode coupled to ground and a cathode coupled to the shunt switch.

18. The IC of claim 15, wherein the precharge circuit sets a bias voltage at the drain of the cascode grounded gate NFET in order to reduce the capacitive loading at the IC pad.

19. The device of claim 18, where the diode network comprises a plurality of diodes connected in series, having an anode of the diode first in the series coupled to the IC pad of the IC, and a cathode of the diode last in the series coupled to the drain of the cascode grounded gate NFET.

20. The device of claim 19, where the diodes are P+NWell diodes.

21. The IC of claim 15, where the diode network comprises at least a first diode having a cathode coupled to the drain of the cascode grounded gate NFET and an anode coupled to the IC pad of the IC.

22. The device of claim 15, where the cascode grounded gate NFET comprises at least a first NFET and a second NFET in cascode configuration, and where the gate of the first NFET device is coupled to ground through a first resistor, the drain of the first NFET device is coupled to the source of the second NFET device, the drain of the second NFET device is coupled to the diode network and the gate of the second NFET device is coupled to power supply through a second resistor.

23. A device including an ESD clamp for providing protection to an IC against positive voltage ESD pulses, comprising:
 means, coupled between an IC pad of the IC and a node of the ESD clamp, for setting the turn on voltage of the device to a desired level, and including a cascode grounded gate NFET, a precharge circuit and a diode network; and
 means for setting a bias voltage at the node to a desired level in order to reduce the capacitive loading at the IC pad,
 where the precharge circuit comprises a diode having an anode coupled to a positive supply and a cathode coupled to the drain of the cascode grounded gate NFET and to the diode network.

24. A device including an ESD clamp having at least a first terminal and a second terminal, for providing protection to an IC against negative voltage ESD pulses, comprising:
 means, coupled between an IC pad of the IC and the first terminal of the ESD clamp, for setting the turn on voltage of the device to a desired level and including a cascode grounded gate NFET characterized by first and second NFETs in cascade configuration; and
 means for setting a bias voltage at the first terminal and at the second terminal of the ESD clamp to a desired level in order to provide a desired negative voltage level to the second terminal of the ESD clamp,
 where the means for setting the bias voltage includes a first terminal coupled to the source of the second NFET, a second terminal coupled to ground and a third terminal coupled to the gate of the first NFET, the third terminal providing a desired negative voltage level to the gate of the first NFET.

25. An IC including an IC pad coupled to an RFFE switch, comprising:
 an ESD clamp having (i) a cascode grounded gate NFET characterized by first and second NFETs in cascade configuration, (ii) means, coupled between the IC pad of the IC and a terminal of the cascode grounded gate NFET, for setting the turn on voltage of the ESD clamp to a desired level, and (iii) means for setting a bias voltage at the terminal of the cascode grounded gate NFET to a desired level in order to reduce the capacitive loading at the IC pad, where the ESD clamp provides protection to the IC against charges caused by positive voltage ESD pulses by providing an electrical path for the ESD charge to discharge from the IC pad to ground; and
 means, coupled between ground and a series switch of the RFFE switch, for providing an electrical path for the ESD charge to discharge to the IC pad from ground to protect the IC against negative voltage ESD pulses,
 where the means for setting the bias voltage includes a first terminal coupled to the source of the second NFET, a second terminal coupled to ground and a third terminal coupled to the gate of the first NFET, the third terminal providing a desired negative voltage level to the gate of the first NFET.

\* \* \* \* \*